United States Patent
Miyakoshi et al.

(10) Patent No.: US 8,368,151 B2
(45) Date of Patent: Feb. 5, 2013

(54) SEMICONDUCTOR DEVICE

(75) Inventors: Kenji Miyakoshi, Ome (JP); Shinichiro Wada, Fuchu (JP); Junji Noguchi, Akishima (JP); Koichiro Miyamoto, Ome (JP); Masaya Iida, Tachikawa (JP); Masafumi Suefuji, Chiba (JP)

(73) Assignee: Hitachi, Ltd., Tokyo (JP)

( * ) Notice: Subject to any disclaimer, the term of this patent is extended or adjusted under 35 U.S.C. 154(b) by 101 days.

(21) Appl. No.: 12/644,461

(22) Filed: Dec. 22, 2009

(65) Prior Publication Data

US 2010/0164015 A1    Jul. 1, 2010

(30) Foreign Application Priority Data

Dec. 26, 2008  (JP) ................. 2008-331862

(51) Int. Cl.
*H01L 21/8234* (2006.01)
*H01L 27/088* (2006.01)

(52) U.S. Cl. ............. 257/392; 438/306; 257/E27.061; 257/E21.619

(58) Field of Classification Search .......... 257/392, 257/E27.061, E21.619; 438/306
See application file for complete search history.

(56) References Cited

U.S. PATENT DOCUMENTS

| 6,198,173 | B1 * | 3/2001 | Huang | 257/536 |
| 7,456,066 | B2 * | 11/2008 | Wu | 438/275 |
| 2008/0308850 | A1 * | 12/2008 | Berthold et al. | 257/288 |

FOREIGN PATENT DOCUMENTS

| JP | 2000-150885 A | 5/2000 |
| JP | 2001-7330 A | 1/2001 |

* cited by examiner

*Primary Examiner* — Calvin Lee
*Assistant Examiner* — Monica D Harrison
(74) *Attorney, Agent, or Firm* — Mattingly & Malur, PC

(57) ABSTRACT

When MOS transistors having a plurality of threshold voltages in which a source and a drain form a symmetrical structure are mounted on the same substrate, electrically-symmetrical characteristics is provided with respect to an exchange of the source and the drain in each MOS transistor. A MOS transistor having a large threshold voltage is provided with a halo diffusion region, and halo implantation is not performed on a MOS transistor having a small threshold voltage.

10 Claims, 3 Drawing Sheets

| No. | SPECIFICATION | Vth[V] | | Vth DEVIATION |
|---|---|---|---|---|
| | | S/D NORMAL | S/D REVERSED | $\Delta$Vth[mV] |
| 1 | HALO IMPLANTATION ANGLE (0°) | −0.516 | −0.463 | 53.0 |
| 2 | HALO IMPLANTATION ANGLE (1°) | −0.540 | −0.439 | 101.5 |
| 3 | HALO IMPLANTATION ANGLE (3°) | −0.649 | −0.361 | 288.8 |
| 4 | HALO IMPLANTATION ELIMINATED | −0.796 | −0.796 | 0.5 |

SEMICONDUCTOR DEVICE

CROSS-REFERENCE TO RELATED APPLICATION

The present application claims priority from Japanese Patent Application No. JP 2008-331862 filed on Dec. 26, 2008, the content of which is hereby incorporated by reference into this application.

FIELD OF THE INVENTION

The present invention relates to a semiconductor device provided with a MOS transistor, and more particularly, the present invention relates to a semiconductor device provided with a plurality of metal oxide semiconductor (MOS) transistors having different threshold voltages from one another.

BACKGROUND OF THE INVENTION

In an RF circuit for a cellular or mobile phone or the like, in recent years, an analog circuit is also manufactured according to a microfabrication process, and a circuit provided with a digital circuit and an analog circuit mounted in a mixed manner (which is called "mixed signal circuit") has been used. In such a mixed signal circuit, a depletion-mode MOS transistor used in an analog circuit such as a regulator section is required in addition to an enhancement-mode MOS transistor configuring a digital circuit in a logical section. Regarding MOS transistors of an N type, for example, a threshold voltage of an enhancement-mode N-type MOS transistor is a positive value, while a depletion-mode N-type MOS transistor is a MOS transistor having a threshold voltage of a negative value. Regarding absolute values of threshold voltages of the enhancement-mode and depletion-mode MOS transistors used in the mixed signal circuit, generally, the absolute value of the latter is often smaller than that of the former. Since electric characteristics of a MOS transistor used in the analog circuit influence the circuit operation, it is required to arrange a plurality of MOS transistors with different threshold voltages within the same or one semiconductor substrate with a high precision.

Incidentally, when magnitudes of threshold voltages are compared with each other in the present specification, the comparison is performed based upon absolute values of the threshold voltages. That is, threshold voltages of an enhancement-mode N-type MOS transistor and a depletion-mode P-type MOS transistor take positive values while threshold voltages of a depletion-mode N-type MOS transistor and an enhancement-mode P-type MOS transistor take negative values, but magnitudes of their absolute values of the threshold values are compared with each other when magnitudes of the threshold voltages are compared. The term "MOS transistor" is also used to mean an ordinary insulated gate field effect transistor.

After the inventors of the present invention had completed the present invention, they conducted a prior art search from the standpoint of prior art referring to a relationship between halo implantation and a threshold voltage of a MOS transistor, so that they found Japanese Patent Application Laid-Open Publication No. 2000-150885 (Patent Document 1) and Japanese Patent Application Laid-Open Publication No. 2001-7330 (Patent Document 2).

Patent Document 1 discloses that, based on a consideration that impurities implanted into a channel region diffused in a thermal treatment step are the cause of a variation in the threshold voltage of a transistor, the variation in the threshold voltage of the transistor is eliminated by aggressively controlling an implantation amount of the impurities implanted into a halo layer performed after a thermal treatment step.

Patent Document 2 discloses that, since an impurity concentration on a source side of a transistor strongly influences a threshold voltage of the transistor while an impurity concentration on a drain side of the transistor strongly influences a short-channel effect, different impurity concentrations are used in halo implantation regions on source and drain sides in order to improve both of the low threshold voltage (a halo layer acts so as to raise the threshold voltage) and the short-channel effect resistance.

SUMMARY OF THE INVENTION

A halo implantation step is performed in manufacturing a MOS transistor advanced in miniaturization, and an object of the halo implantation is to suppress the short-channel effect that lowers a threshold voltage along with a reduction of a gate length.

In the MOS transistor, it is desired that a source and a drain have a symmetrical structure except for an unintended case, and a difference (hereinafter, called "asymmetrical characteristics") due to a connection exchange of a source and a drain does not occur in electric characteristics of the MOS transistor. However, the present inventors have found that electrical asymmetrical characteristics occur in a MOS transistor having a small threshold voltage, especially, the asymmetrical characteristics occur in a threshold voltage of the MOS transistor. As a result of an examination of the cause, the present inventors have found out that the asymmetrical characteristics of the threshold voltage are caused by asymmetrical formation of halo diffusion layers formed in the halo implantation step.

Characteristics of a MOS transistor, especially, a threshold voltage thereof, are generally controlled by a channel diffusion layer formed on a substrate (a well diffusion layer). The channel diffusion layer is formed by ion implantation before formation of a gate insulating film and a gate electrode. An ion-implantation region for forming the channel diffusion layer has a channel length larger than that at a completion of the MOS transistor, and even if an angle of ion implantation to a surface of the substrate varies when performing an ion implantation, the channel diffusion layer is formed to have an even impurity concentration. Therefore, the asymmetrical characteristics of the threshold voltage due to formation of the channel diffusion layer do not occur. On the other hand, formation of the halo diffusion layer is performed after formation of the gate oxide film and the gate electrode, and the halo diffusion layer is locally formed to cover a lower portion of a lightly doped drain (LDD) layer. Thus, if the angle of ion implantation to the surface of the substrate varies upon the ion implantation, an asymmetrical halo diffusion region is formed.

Generally, when a depletion-mode MOS transistor having a low threshold voltage is provided in a mixed manner with an enhancement-mode MOS transistor, a halo diffusion layer of the depletion-mode MOS transistor is formed at the same step as a step of forming a halo diffusion layer of the enhancement-mode MOS transistor. At this time, the following problem occurs. In a low-threshold-voltage MOS transistor having a channel diffusion layer relatively lower in impurity concentration than that of the enhancement-mode MOS transistor, the impurity concentration in a halo diffusion layer thereof has more influence on the threshold voltage than in a high-threshold-voltage MOS transistor. Also, in the depletion-mode MOS transistor in which conductivities of impurities in the channel diffusion layer and the halo diffusion layer are opposite, the threshold voltage is constrained at a portion where the channel diffusion layer and the halo diffusion layer overlap with each other. In each case, the threshold voltage is constrained by the halo diffusion layer, and when the halo diffusion layer is formed asymmetrically, the threshold voltage also has asymmetry.

FIG. 2 lists average values of variations of threshold voltages of depletion-mode MOS transistors of an N-conductivity type having a small threshold voltage within a wafer plane. Threshold voltages of No. 1 to No. 3 indicate values obtained under the conditions of implantation angles 0°, 1°, and 3° upon forming a halo diffusion layer. Here, the implantation angle is defined on a plane parallel to a direction of a gate length and perpendicular to a silicon wafer, and a normal axis to the silicon wafer is defined as 0°. An average value of threshold voltages within a wafer plane is represented as "Vth," and a connection of a source and a drain to a wafer in a certain direction is described as "S/D normal" while a connection of the source and the drain exchanged with respect to the S/D normal is described as "S/D reversed." An average value of differences in threshold voltage between the S/D normal and the S/D reversed within the wafer plane is described as "ΔVth." Here, the Vth is defined as a gate voltage obtained when a source-drain current exceeds 10 nA by sweeping the gate electrode from −1 V in a positive direction with 0.01 V increments while such a condition that a drain voltage is 5 V and a source voltage and a substrate voltage are 0 V is fixed in a MOS transistor having a gate width of 10 μm.

As illustrated in FIG. 2, dependency of ΔVth to the halo-implantation angle is large, and thus the difference is doubled in the Vth due to the exchange of the source and drain under the condition of the ion-implantation angle of 3°. Such a fact can be explained as follows. Since the halo implantation step is performed after gate formation, the amount of ions implanted into a semiconductor surface of one gate end portion is decreased according to an increase of the implantation angle as the gate becomes an obstacle, and the amount of ions implanted to the semiconductor surface of the other gate end portion is increased as reaching a lower portion of the gate because the implantation is performed obliquely. In the above manner, the ion amounts forming the halo diffusion layer at the gate end portions are different to each other, so that the threshold voltage determined by the impurity concentration on the source side shows asymmetry when the S/D exchange is performed.

One representative example of the present invention is as follows. That is, a first MOS transistor and a second MOS transistor are formed on a main surface of a semiconductor substrate of a first conductivity type, the first MOS transistor including: source/drain regions of a second conductivity type; a gate electrode provided on the main surface positioned between the source/drain regions interposing a gate insulating film; a channel diffusion region of a first conductivity type formed on the semiconductor substrate positioned below the gate electrode; LDD regions of the second conductivity type formed on the semiconductor substrate positioned between the channel diffusion region and the source/drain regions and having a concentration lower than those of the source/drain regions; and halo diffusion regions of the first conductivity type just below the LDD regions and the source/drain regions, and the second MOS transistor including: source/drain regions of the second conductivity type; a gate electrode provided on the main surface positioned between the source/drain regions interposing a gate insulating film; a channel diffusion region of the first conductivity type formed on the semiconductor substrate below the gate electrode; and LDD regions of the second conductivity type formed on the semiconductor substrate between the channel diffusion region and the source/drain regions, wherein an impurity concentration of the channel diffusion region of the second MOS transistor is smaller than that of the channel diffusion region of the first MOS transistor, and the second MOS transistor includes no halo diffusion region of the first conductivity type just below the LDD regions and the source/drain regions.

Further, a process for forming transistors different from each other regarding presence/absence of halo implantation includes a first step of forming gate electrodes, a second step of forming a first substrate concentration profile using a first photomask, and a third step of forming a second substrate concentration profile using a second photomask, wherein the second step and the third step form LDD regions of transistors utilizing the gate electrode formed at the first step as a mask, respectively, and the second step forms halo diffusion regions of the transistors utilizing the gate electrode formed at the first step as a mask, while the third step does not form the halo diffusion region of the transistor.

Two kinds of MOS transistors of the same conductivity type different in threshold voltage are formed on the same or one substrate, and the short-channel effect of an enhancement-mode MOS transistor having a large threshold voltage is suppressed as well as suppressing a variation in threshold voltage of an enhancement-mode or depletion-mode MOS transistor having a small threshold voltage.

DETAILED DESCRIPTIONS OF THE PREFERRED EMBODIMENTS

Embodiments of the present invention will be described in detail below with reference to the drawings. In the following, an example of an N-conductivity-type MOS transistor will be described, but this explanation holds true with a P-conductivity-type MOS transistor obtained by reversing all polarities (conductivities) in the structure of the N-conductivity-type MOS transistor. The semiconductor substrate indicates a concentration layer forming a channel inversion region of a MOS transistor, and it indicates not only a substrate of a silicon wafer, but also a region generally called a well in a MOS transistor such as an epitaxial layer and a diffusion layer formed by ion implantation.

First Embodiment

Figures 1, 2:
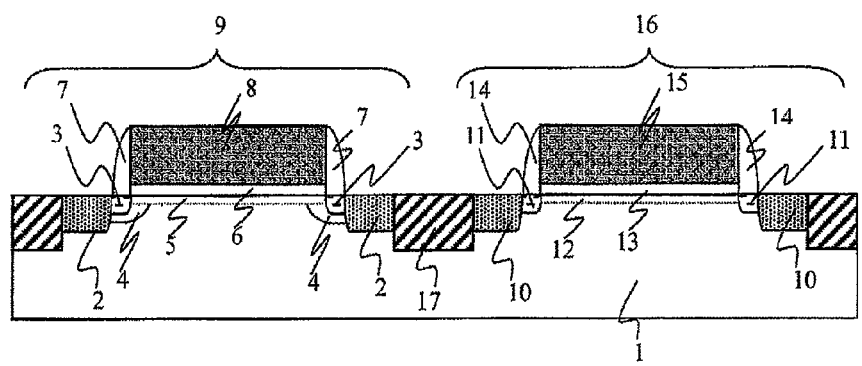
FIG. 1 is a sectional view of a device illustrating a first embodiment.
FIG. 2 is a table illustrating an influence of halo implantation on a threshold voltage of a transistor.

FIG. 1 illustrates an embodiment of a MOS transistor structure of the present invention. In FIG. 1, a first MOS transistor 9 and a second MOS transistor 16 are formed on a p-type semiconductor substrate 1. The first MOS transistor 9 and the second MOS transistor 16 are isolated such that a source and a drain are electrically isolated by a device isolation insulating film 17. Here, a threshold voltage of the second MOS transistor 16 is smaller than that of the first MOS transistor 9.

Reference numeral 2 denotes a high concentration source/drain diffusion layer (N' type). Reference numeral 3 denotes a first low-concentration LDD diffusion layer (N type) provided at a side portion of the source/drain diffusion layer 2. Reference numeral 4 denotes a low concentration halo diffusion layer (P type) provided below the source/drain diffusion layer 2 and the LDD diffusion layer 3. Reference numeral 5 denotes a first low-concentration channel diffusion layer (P type) provided between the source/drain diffusion layers 2. Reference numeral 6 denotes a first gate oxide film. Reference numeral 7 denotes a first insulating film. Reference numeral 8 denotes a first gate electrode (N'type). The first MOS transistor 9 is configured with these members.

Reference numeral 10 denotes a second high-concentration source/drain diffusion layer (N'type). Reference numeral 11 denotes a second low-concentration LDD diffusion layer (N type) provided at a side portion of the source/drain diffusion layer 10. Reference numeral 12 denotes a second low-concentration channel diffusion layer (P type) provided between the source/drain diffusion layers 10. Reference numeral 13 denotes a second gate oxide film. Reference numeral 14 denotes a second insulating film. Reference numeral 15 denotes a second gate electrode ($N^+$ type). The second MOS transistor 16 is configured from these members.

Here, since the threshold voltage of the second MOS transistor 16 is smaller than that of the first MOS transistor 9, the impurity concentration in the second low-concentration channel diffusion layer 12 is lower than that in the first low-concentration channel diffusion layer 5.

In addition, since both the first and second MOS transistors have the channel diffusion layers 5 and 12 which are the same P-type as the semiconductor substrate 1, threshold voltages thereof have positive offsets to a substrate potential, namely, they are enhancement-mode transistors.

The MOS transistors illustrated in FIG. 1 are manufactured according to a microfabrication process (for example, 0.18 µm process). A feature of the microfabrication process lies in that an LDD (lightly doped drain) structure is formed by the low concentration LDD diffusion layers 3 and 11 to relax the high electric field between the high concentration source/drain diffusion layers 2 and 10 and the semiconductor substrate 1.

The feature of the structure illustrated in FIG. 1 lies in that a pocket structure is formed by the low-concentration halo diffusion layer 4 in the first MOS transistor 9 to suppress the short-channel effect due to scaling of the gate while the second MOS transistor 16 is not provided with a halo diffusion layer. In the second MOS transistor 16, since its low-concentration channel diffusion layer is lower in impurity concentration than the low-concentration channel diffusion layer of the first MOS transistor 9, a variation of ion implantation for formation of the halo diffusion layer, especially, asymmetry of the source/drain occurs more easily than in the first MOS transistor 9, but since the second MOS transistor 16 is not provided with a halo diffusion layer, it can suppress the occurrence of the variation and the asymmetry. As a result, a deviation of the threshold voltage measured when the source and the drain of the second MOS transistor 16 are exchanged can be made lower than or equal to that measured when the source and the drain of the first MOS transistor 9 are exchanged.

Here, it is desired to make a gate length of the second MOS transistor 16 longer than that of the first MOS transistor 9 in order to suppress the short-channel effect of the second MOS transistor 16. Accordingly, the second MOS transistor 16 is larger in device size than the first MOS transistor 9, but area overhead due to elongation of the gate length can be suppressed so as to be negligible by using the first MOS transistor 9 in a logic circuit which has a large logic scale or a high-frequency circuit and using the second MOS transistor 16 in only an analog circuit.

Figure 4:
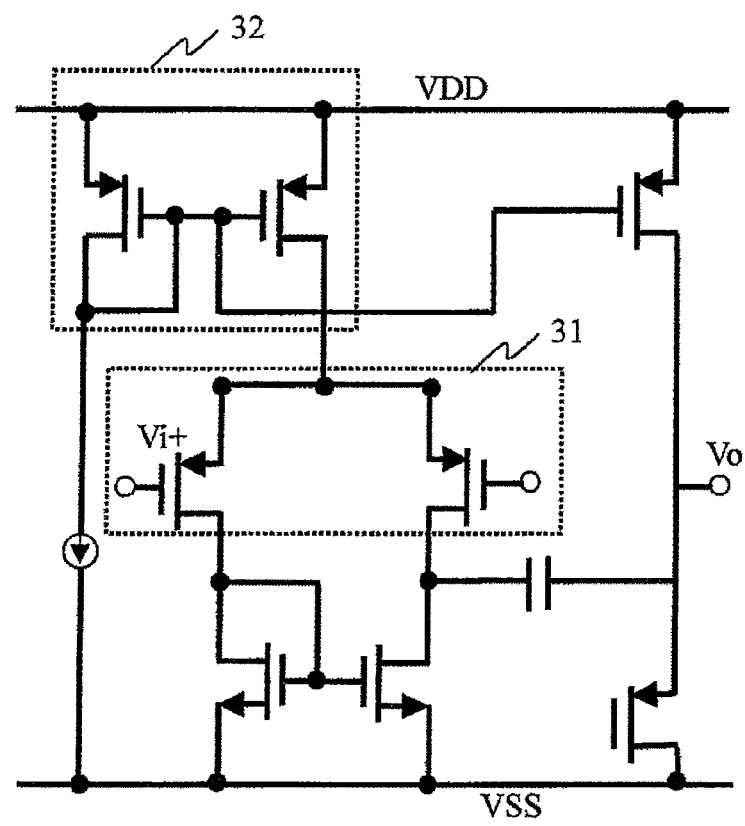
FIG. 4 is a circuit diagram illustrating one example of an operational amplifier circuit using transistors of the present invention.

For example, as an example of an analog circuit to be provided with the transistor of the present invention, an operational amplifier circuit is illustrated in FIG. 4. In the operational amplifier circuit, as analog characteristics are important in a differential amplifier circuit 31, a current mirror circuit 32, or the like, variation control of a threshold voltage with a high precision is required. On the other hand, a high-output current or chip shrinkage rather than the variation control is important in a logic circuit or the like used as the digital circuit. Therefore, the second MOS transistor 16 is used in an analog circuit requiring variation control of a threshold voltage with a high precision, while the first MOS transistor 9 is used in a digital circuit requiring a high-speed operation or chip shrinkage. For example, in the example illustrated in FIG. 4, the second MOS transistors 16 are used as transistors configuring the circuits 31 and 32, while the first MOS transistors 9 are used as the other transistors than the circuits 31 and 32.

Since the second MOS transistor is not provided with a low concentration halo diffusion layer, there is a possibility that the short-channel effect occurs in the second MOS transistor more easily than in the first MOS transistor. As a countermeasure for avoiding the short-channel effect, there is a way to make the gate length of the second MOS transistor 16 longer than that of the first MOS transistor 9, as described above. Even when such a method is adopted, since an analog circuit in which the second MOS transistor 16 is effectively used or a circuit portion severely requiring the analog characteristics is limited to part of a chip, area overhead due to elongation of the gate length of the second MOS transistor 16 can be minor.

Incidentally, in the configuration example illustrated in FIG. 1, an example where no halo diffusion layer is formed in the second MOS transistor 16 is illustrated, but it is made possible to suppress the asymmetrical characteristics of the threshold voltage to obtain the suppression of the short-channel effect due to the halo diffusion layer by making the halo diffusion layer have an impurity concentration lower than that in the low-concentration halo diffusion layer of the first MOS transistor 9.

Second Embodiment

Figure 3:
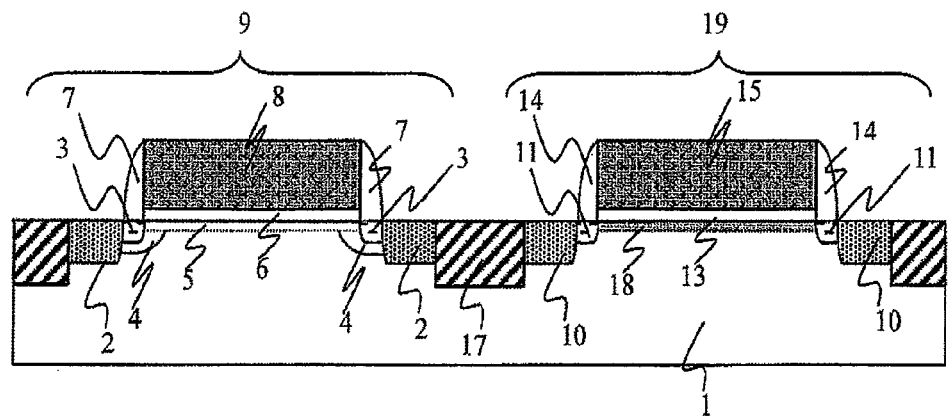
FIG. 3 is a sectional view of a device illustrating a second embodiment.

FIG. 3 illustrates another embodiment (second embodiment) of the present invention. A difference from the first embodiment lies in that a threshold voltage of a third MOS transistor 19 is changed to that of a depletion mode by changing the type of the low-concentration channel diffusion layer 18 of the third MOS transistor 19 to $N^-$ type. Since the structure except for the third MOS transistor 19 of the second embodiment is the same as that of the first embodiment, descriptions thereof will be omitted. The first MOS transistor 9 is used in a logic circuit having a large logic scale or a high frequency circuit, while the third MOS transistor 19 is used as a resistor for a reference voltage circuit in an analog circuit having a threshold voltage of a depletion mode. Since the third MOS transistor 19 is used as a resistance element, it is unnecessary to make the gate length shorter and it is also unnecessary to provide a halo diffusion layer.

Third Embodiment

Figure 5:
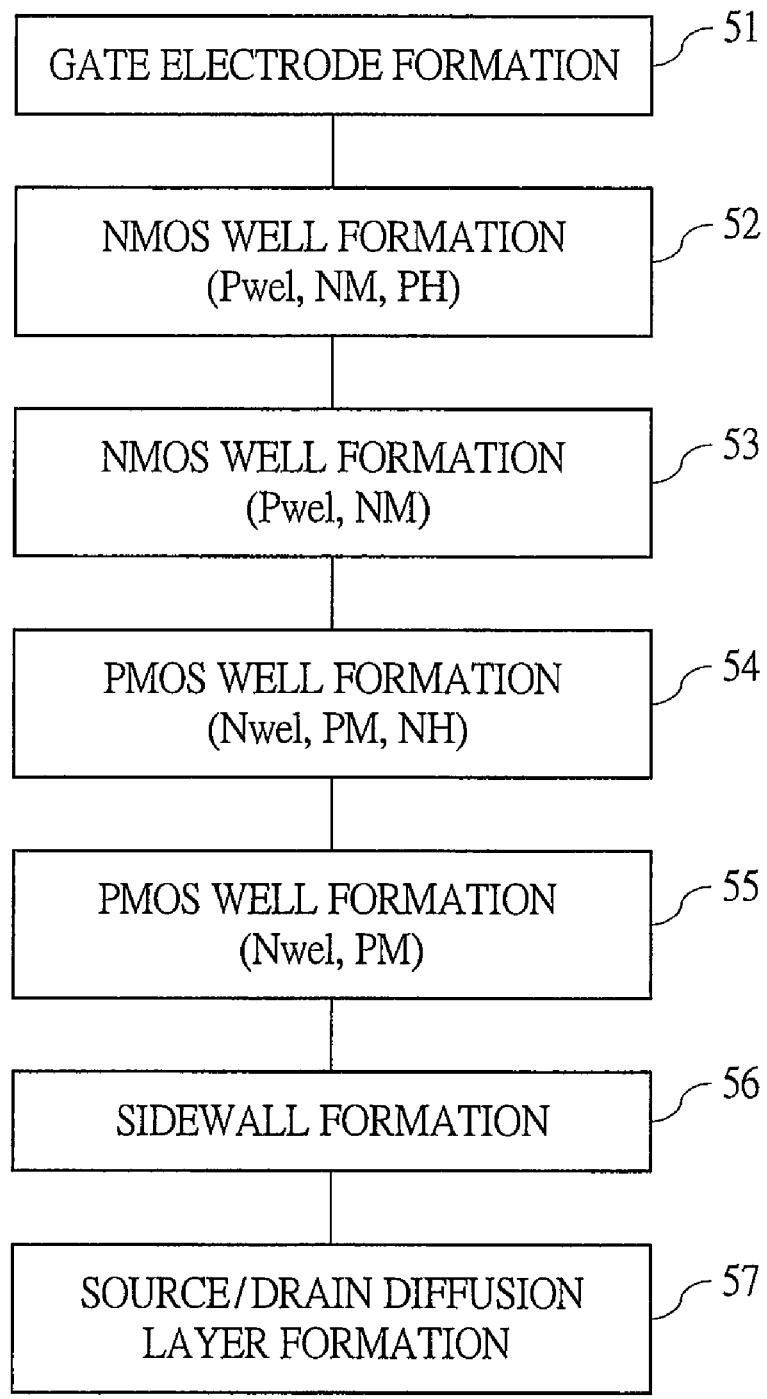
FIG. 5 is a flowchart illustrating steps of forming transistors.

FIG. 5 illustrates one example of a manufacturing process of the transistors illustrated in FIG. 1 or FIG. 3. The manufacturing process illustrated in FIG. 5 has a feature especially in the number of photomasks and the number of manufacturing steps being reduced by forming the above-mentioned first MOS transistor 9 and second MOS transistor 16 after formation of the gate electrodes. Regarding the device, descriptions will be made below with reference to FIG. 1.

First, after a step 51 of forming gate electrodes (gate electrodes 8 and 15), well-forming steps 52 to 55 are performed. The well-forming steps 52 and 54 include halo diffusion region formation, and they are well-forming steps for the first MOS transistor 9. The well-forming steps 53 and 55 include no halo diffusion region formation, and they are well-forming steps for the second MOS transistor 16. Each of the well-forming steps is performed using one mask.

In the well-forming step 52, formation of well regions and channel diffusion regions (semiconductor substrate 1 and channel diffusion layers 5 and 12, Pwel), formation of LDD diffusion regions (LDD diffusion layers 3 and 11, NM), and formation of a halo diffusion region (halo diffusion layer 4, PH) are conducted by performing ion implantation. In the formation of the well regions and channel diffusion layers, the well regions and channel diffusion regions can be formed by performing ion implantation to achieve such a profile that an impurity concentration is higher in deep portions of the respective regions of the substrate and the impurity concentration is lower on surface side of the substrate. The formation of the LDD diffusion regions and the halo diffusion region is performed by ion implantation using the gate electrodes formed previously as masks (self-alignment). The well-forming step can be performed with using one photomask, so that the profile of a plurality of semiconductor regions configuring a transistor can be formed at one step, which results in reduction of the number of manufacturing steps.

The well-forming step 53 is similar to the well-forming step 52, but formation of the halo diffusion region is not performed in the well-forming step 53. When the MOS transistor to be formed in the well-forming step 53 is the depletion-mode MOS transistor in FIG. 3, it is necessary to make impurities to be implanted to the channel diffusion region and the well region different because the polarity (conductivity) of the channel diffusion region is different from that of the well region.

The well-forming step 54 is different in polarity from the well-forming step 52, and the well-forming step 55 is different in polarity from the well-forming step 53. It goes without saying that the well-forming steps 52 to 55 are used depending on the type of a transistor to be formed. For example, the well-forming step 53 becomes unnecessary in a process for a semiconductor device which does not include a second MOS transistor of N-type conductivity. The order of the well-forming steps is not limited to the order illustrated in FIG. 5.

Thereafter, the first MOS transistor 9 and the second MOS transistor 16 are formed through a sidewall (insulating films 7 and 14) forming step 56 and a source/drain diffusion layer (source/drain diffusion layers 2 and 10) forming step 57.

Note that the forming steps described as the third embodiment are forming steps which can be used even when a threshold voltage of a transistor formed in the well-forming step 52 (54) is equal to that of a transistor formed at the well-forming step 53 (55).

What is claimed is:
1. A semiconductor device comprising:
a first metal oxide semiconductor (MOS) transistor and a second MOS transistor commonly formed on a main surface of a semiconductor substrate of a first conductivity type,
wherein the first MOS transistor includes: source and drain regions of a second conductivity type; a gate electrode provided on the main surface between the source and drain regions interposing a gate insulating film; a channel diffusion region of the first conductivity type formed on the semiconductor substrate below the gate electrode; lightly doped drain (LDD) regions of the second conductivity type formed on the semiconductor substrate between the channel diffusion region and the source and drain regions and having an impurity concentration lower than those of the source and drain regions; and halo diffusion regions of the first conductivity type formed just below the LDD regions and in portions of the source and drain regions,
wherein the second MOS transistor includes: source and drain regions of the second conductivity type; a gate electrode provided on a gate insulating film on the main surface between the source and drain regions; a channel diffusion region of the second conductivity type formed on the semiconductor substrate below the gate electrode; and LDD regions of the second conductivity type formed on the semiconductor substrate between the channel diffusion region and the source and drain regions,
wherein the second MOS transistor includes no halo diffusion region of the first conductivity type just below the LDD regions and in portions of the source and drain regions, and
wherein the first conductivity type is a different conductivity type than the second conductivity type.
2. The semiconductor device according to claim 1, wherein a gate length of the second MOS transistor is longer than that of the first MOS transistor.
3. The semiconductor device according to claim 1, wherein a threshold voltage of the second MOS transistor is lower than that of the first MOS transistor.
4. The semiconductor device according to claim 1, wherein the channel diffusion regions and the LDD regions of the first MOS transistor and the second MOS transistor are formed after formation of the gate electrodes.
5. The semiconductor device according to claim 1, wherein a threshold voltage deviation obtained in case that a source and a drain of the second MOS transistor are exchanged is equal to or lower than that obtained in case that a source and a drain of the first MOS transistor are exchanged.
6. A semiconductor device comprising:
a first metal oxide semiconductor (MOS) transistor and a second MOS transistor commonly formed on a main surface of a semiconductor substrate of a first conductivity type,
wherein the first MOS transistor includes: source and drain regions of a second conductivity type; a gate electrode provided on the main surface between the source and drain regions interposing a gate insulating film; a channel diffusion region of the first conductivity type formed on the semiconductor substrate below the gate electrode; lightly doped drain (LDD) regions of the second conductivity type formed on the semiconductor substrate between the channel diffusion region and the source and drain regions and having an impurity concentration lower than those of the source and drain regions; and halo diffusion regions of the first conductivity type formed just below the LDD regions and in portions of the source and drain regions,
wherein the second MOS transistor includes: source and drain regions of the second conductivity type; a gate electrode provided on a gate insulating film on the main surface between the source and drain regions; a channel diffusion region of the first conductivity type formed on the semiconductor substrate below the gate electrode; and LDD regions of the second conductivity type formed on the semiconductor substrate between the channel diffusion region and the source and drain regions, wherein an impurity concentration of the channel diffusion region of the second MOS transistor is smaller than that of the channel diffusion region of the first MOS transistor, and the second MOS transistor includes no halo diffusion region of the first conductivity type just below the LDD regions and in portions of the source and drain regions, and wherein the first conductivity type is a different conductivity type than the second conductivity type.

7. The semiconductor device according to claim 6, wherein a gate length of the second MOS transistor is longer than that of the first MOS transistor.

8. The semiconductor device according to claim 6, wherein a threshold voltage of the second MOS transistor is lower than that of the first MOS transistor.

9. The semiconductor device according to claim 6, wherein the channel diffusion regions and the LDD regions of the first MOS transistor and the second MOS transistor are formed after formation of the gate electrodes.

10. The semiconductor device according to claim 6, wherein a threshold voltage deviation obtained in case that a source and a drain of the second MOS transistor are exchanged is equal to or lower than that obtained in case that a source and a drain of the first MOS transistor are exchanged.

* * * * *